Jan. 26, 1960
R. DOLDER
SEMI-CONDUCTOR DEVICE
Filed May 6, 1957
2,922,935
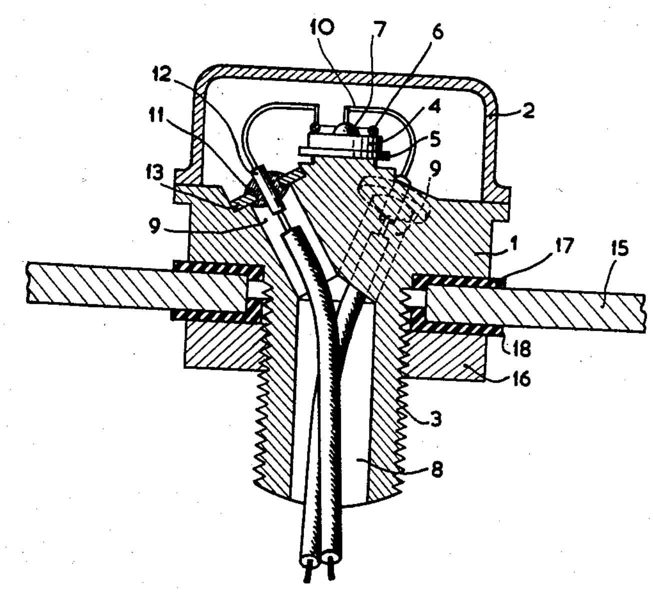
INVENTOR
ROBERT DOLDER
BY *Frank R. Jefani*
AGENT

United States Patent Office 2,922,935

Patented Jan. 26, 1960

2,922,935

SEMI-CONDUCTOR DEVICE

Robert Dolder, Zurich, Switzerland, assignor to North American Philips Company, Inc., New York, N.Y., a corporation of Delaware Application May 6, 1957, Serial No. 657,147

Claims priority, application Netherlands July 27, 1956

4 Claims. (Cl. 317—235)

This invention relates to semi-conductor devices, and in particular to such devices of the power-type.

An object of the invention is to provide a new and improved envelope and mount construction for semi-conductor devices.

A further object of the invention is the provision of a semi-conductor device containing means for mounting on a chassis and wherein the lead-in or supply wires of the device are accessible from beneath the chassis.

Still a further object of the invention is the provision of a power semi-conductor device of relatively small size, and wherein the electrode assembly on the interior may be completed before the envelope is sealed-off.

These and further objects of the invention will be better understood from the following description.

Briefly, in accordance with the invention, the electrode assembly, including the lead-in conductors, is mounted on a mount or support from which depends a threaded stud for securing the device to a chassis or supporting plate. Traversing the mount and stud is an aperture, or more specifically a bore, through which pass the lead-in conductors, which thus project from the semi-conductor device at the stud end. The aperture in the mount is sealed off in a vacuum-tight manner, and a suitable enclosure, preferably of metal, is then hermetically secured to the mount over the electrode assembly, thereby protecting the interior of the enclosure from the outside atmosphere.

The invention will now be described in greater detail with reference to the accompanying drawing, in which the sole figure is a cross-sectional view of one form of semi-conductor device in accordance with the invention shown mounted in position on a supporting plate.

Referring now to the drawing, the device illustrated is a power transistor, though the invention is equally applicable to other types of semi-conductor devices, such as diodes. The device comprises an envelope including a base member 1, serving as a mount or support, and a cover or cap 2, which is cold-welded and thus hermetically sealed to the base 1. The envelope is preferably constituted of metal of relatively high thermal conductivity, such as copper, for example. The base 1, which serves as a heat sink or dissipator, is preferably constituted of solid copper, and is provided with a depending stud 3 to facilitate mounting in an aperture in a suitable chassis or supporting plate 15. In a preferred arrangement, the stud 3 is threaded, as shown in the drawing, and cooperates with a threaded nut 16 to secure the device tightly in position and thus in good thermal contact with the supporting plate 15, which also functions as a heat sink. Mounted between the metal envelope of the device and the chassis 15 is a suitable electrically-insulating, yet thermally-conducting washer 17 and an insulating bushing 18, so that the envelope can be maintained above ground potential, if desired.

Secured within the envelope is the electrode assembly of the device, which, for illustrative purposes only, may comprise a germanium or silicon semi-conductive wafer or body 4. The wafer 4 is soldered by means of indium solder to a molybdenum plate 5, which in turn is soldered to a central portion of the base or mount 1. The indium solder securing the plate 5 to the wafer 4 produced in the latter a p–n junction, subsequently to serve as the collector electrode of the device. To the opposite side of the wafer 4 is fused an indium-gallium pellet 7, producing a fused alloy junction in the wafer 4 to serve as an emitter electrode, which is surrounded by a soldered ring 6, which produces an ohmic base contact to the wafer 4. As the collector is secured directly to the mount 1, the latter naturally constitutes an electrical terminal therefor. This is further desirable because most of the heat generated in the device during operation is generated at the collector junction, and thus direct mounting thereof on and the resultant good thermal contact with the solid, copper mount 1 enables improved dissipation of said heat and thus operation of the device at higher power levels. The heat in the mount or base 1 is in turn dissipated to the supporting plate 15, with which it is in a close thermal or heat-dissipating relationship.

Since the envelopes 1 and 2 are at collector potential, whatever that may be, the emitter 7 and base connections 6 must therefore be insulated from the envelope. To this end, they are provided with lead-in conductors or supply wires 10. Passage of these lead-in conductors to the outside of the envelope is afforded by providing in the base 1 two apertures or bores 9, which communicate with a common aperture or bore 8 traversing the mounting stud 3. Thus the lead-in conductors 10 exit from the device from the bottom end of the mounting stud 3, and thus are readily accessible from beneath the chassis or supporting plate 15, like most other electrical tubes or components, which is an important advantage of the construction of the invention.

As the electrode assembly needs be isolated from the atmosphere, since it may be contaminated by impurities or have its characteristics affected by humidity changes, the apertures 9 are each sealed-off by a vacuum-tight seal, which is traversed by the respective conductor 10 in a vacuum-tight manner. Only the left-hand bore 9 is shown in cross-section, since the other bore on the right is directed backwards into the plane of the drawing as well as upwards.

The vacuum-tight lead-through connections in both bores 9, shown for simplicity only in the bore on the left, are provided by a glass bead 11 sealed to a small metal tube 12, in turn secured by soldering to the conductor 10. The glass bead 11, which provides electrical insulation of the conductors 10, is mounted on a metal ring 13, which is soldered in position on the base or mount 1. A similar connection exists in the right bore 9. This is the preferred arrangement. As an alternative, a common vacuum-tight lead-through connection for both conductors 10 may be provided in the bore 8, though this would be more difficult to fabricate from a production standpoint. After passing through the lead-through connection, the lead-in wires 10 are provided with insulation as shown, so that the bare wire will not contact the metal surrounding the bores 8 and 9.

The device may be assembled in the following fashion. First the electrode assembly of the emitter and base electrodes are made to the wafer 4, and then the latter is soldered to the copper base 1, which may already have been provided with the rings 13. Next the conductors 10 are secured to the base and emitter electrodes, and then in turn passed through the rings 13 and mounted in place with the glass beads 11. Thereafter, the electrode assembly may be carefully cleaned and even further etched, if desired, and then the cover 2 placed in position and cold-welded to the base 1, for example in an inert gas atmosphere, so that the envelope is filled with an inert gas after completion. Thus the electrode assembly in the interior of the envelope is completely isolated from the atmosphere. If desired, the cover 2 can be secured to the base 1 by other well-known techniques, such as soldering or resistance-welding. Also, if desired the interior of the envelope may be evacuated before sealing-off.

As will be appreciated, the construction of the invention possesses many advantages over the prior art arrangement. In particular, the entire device is assembled on the base 1 itself, thus permitting careful cleaning of the assembly before mounting of the cover 2 and thus closing-off of the envelope. Further, the leads exit from the envelope at the stud 3, and thus are accessible beneath the chassis or supporting plate like other electrical components. More, the simple manner in which the interior of the envelope is hermetically sealed-off from the atmosphere is another important gain achieved. Finally, the provision of the bores in the copper base 1 has no noticeable effect on its ability to dissipate rapidly and effectively large amounts of heat developed in the electrode assembly during operation.

It will be observed that the invention has been described in connection with a construction wherein a central bore in the mounting stud branches off into two channels or bores in the base 1, which thus terminate at spaced positions on the interior of the envelope. This has the advantage of affording separate passages for the base and emitter connections and simplifying their assembly. However, as an alternative, a single bore through the copper block 1 may be provided, through which both connections pass and are vacuum-tight sealed-off in like manner to that illustrated in the drawing.

While I have described my invention in connection with specific embodiments and applications, other modifications thereof will be readily apparent to those skilled in this art without departing from the spirit and scope of the invention as defined in the appended claims.

What is claimed is:

1. A semi-conductor device of the power type comprising a vacuum-tight sealed metal envelope including a base portion serving as a heat sink and provided with a threaded mounting stud for mounting of said device on a suitable support, a semi-conductive assembly within the envelope and mounted on said base portion and in good thermal contact therewith, said base portion and mounting stud containing a bore communicating with the inside and outside of the envelope, a lead-in conductor traversing said bore and connected within said envelope to said semi-conductive assembly, and means vacuum-tight sealing-off said bore and insulatingly securing said lead-in conductor in position therein, whereby the semi-conductive assembly is made inaccessible to the outside atmosphere.

2. A semi-conductor device as claimed in claim 1, wherein the device is a diode.

3. A power transistor comprising a vacuum-tight sealed metal envelope including a base portion serving as a heat sink and provided with a threaded mounting stud for mounting of said transistor on a suitable support, a semi-conductive assembly within the envelope and mounted on said base portion and in good thermal contact therewith, said mounting stud containing a single bore and the base portion containing a plurality of spaced bores communicating with the single bore in the stud and the interior of the envelope, lead-in conductors separately traversing each of the bores in the base portion and traversing the single bore in the stud and connected within said envelope to said semi-conductive assembly, and means vacuum-tight sealing-off said bores and insulatingly securing said lead-in conductors in position therein, whereby the semi-conductive assembly is made inaccessible to the outside atmosphere.

4. A power transistor as set forth in claim 3 wherein each of the bores in the base portion is separately vacuum-tight sealed-off.

References Cited in the file of this patent

UNITED STATES PATENTS

| | | |
|---|---|---|
| 2,609,426 | Bugel | Sept. 2, 1952 |
| 2,790,940 | Prince | Apr. 30, 1957 |
| 2,820,929 | Coy | Jan. 21, 1958 |